United States Patent [19]

Matsushita et al.

[11] Patent Number: 4,970,410
[45] Date of Patent: Nov. 13, 1990

[54] SEMICONDUCTOR INTEGRATED CIRCUIT DEVICE HAVING IMPROVED INPUT/OUTPUT INTERFACE CIRCUIT

[75] Inventors: Shoji Matsushita, Tosashimizu; Masaharu Kimura, Kawasaki, both of Japan

[73] Assignee: Fujitsu Limited, Kawasaki, Japan

[21] Appl. No.: 333,922

[22] Filed: Apr. 6, 1989

[30] Foreign Application Priority Data

Apr. 8, 1988 [JP] Japan .................. 63-86871

[51] Int. Cl.⁵ .................. H03K 3/33; H03K 3/335
[52] U.S. Cl. .................. 307/303; 307/465; 307/243; 307/475
[58] Field of Search .................. 307/303, 303.1, 475, 307/465, 465.1, 243; 328/105

[56] References Cited

U.S. PATENT DOCUMENTS

| | | | |
|---|---|---|---|
| 4,124,899 | 11/1978 | Birkner et al. | 307/465 |
| 4,684,830 | 8/1987 | Tsui et al. | 307/465 |
| 4,789,951 | 12/1988 | Birkner et al. | 307/465 |
| 4,857,773 | 8/1989 | Takata et al. | 307/465 |

*Primary Examiner*—Stanley D. Miller
*Assistant Examiner*—Richard Roseen
*Attorney, Agent, or Firm*—Armstrong, Nikaido, Marmelstein, Kubovcik & Murray

[57] ABSTRACT

A semiconductor integrated circuit device includes an external terminal, an internal logic circuit, and an input/output interface circuit. The input/output interface circuit includes an input circuit, a selection circuit and an output circuit. The input circuit receives an input signal and supplies the internal logic circuit with the same. The selection circuit selects either the input signal supplied from the input circuit or an output signal supplied from the internal logic circuit. The output circuit outputs the selected one of the input signal and output signal to the external terminal. A loop circuit is formed by the input circuit, selection circuit and output circuit. The loop circuit logically includes an odd number of inverters.

21 Claims, 6 Drawing Sheets

SEMICONDUCTOR INTEGRATED CIRCUIT DEVICE HAVING IMPROVED INPUT/OUTPUT INTERFACE CIRCUIT

BACKGROUND OF THE INVENTION

The present invention generally relates to a semiconductor integrated circuit device having an improved input/output interface circuit, and in particular to an input/output interface circuit which is designed to be subjected to a variety of tests with ease.

Generally, large scale integrated circuit devices (LSI devices) are subjected to a variety of tests in order to investigate whether or not LSI devices operate correctly. In test, LSI devices are activated under a specified operational condition, and it is investigated whether or not LSI devices operate without exhibiting abnormality. Functional test and DC characteristic test are typical of test of LSI devices. For example, in functional test, a predetermined pattern is supplied to an LSI device, and it is investigated whether or not a corresponding pattern is output from the LSI device. In direct current characteristic test (hereafter simply referred to as DC test), an external terminal other than an external terminal to be tested is set to a specified condition. In this state, a specified current is made applied or outputted to the external terminal to be tested. Then, the DC voltage of the external terminal to be tested is measured. Thereby, it is determined, based on the measured voltage, as to whether or not the LSI device can operate correctly in view of DC characteristics.

Generally, LSI devices includes external terminals, input/output circuits, and internal logic circuits. In conventional LSI device test, a signal applied to an external terminal other than an external terminal to be tested, passes through an input/output interface circuit, an internal logic, and input/output interface circuit. Then a signal responsive to the applied signal appears at the external terminal to be tested. That is, the applied signal such as a test pattern always passes through the internal logic circuit. For this reason, it is difficult to directly investigate the input/output interface circuit itself. In particular, it is very difficult to investigate that an input circuit which is a part of input/output interface circuits, operates correctly. Additionally, an external device which generates test patterns must be used in test. Moreover, it takes long to execute test programs to test LSI devices.

SUMMARY OF THE INVENTION

It is therefore a general object of the present invention to provide a semiconductor integrated circuit device having an improved input/output interface circuit in which the aforementioned disadvantages are eliminated.

A more specific object of the present invention to provide a semiconductor integrated circuit device having an improved input/output interface circuit which is directly and easily subjected to tests for investigating whether or not the input/output interface circuit operates correctly.

Another object of the present invention is to provide a semiconductor integrated circuit device having an improved input/output interface circuit which is subjected to tests without using a specific test pattern generator.

The above objects of the present invention can be achieved by a semiconductor integrated circuit device including an external terminal; internal logic means for subjecting a first signal to a predetermined logic operation and outputting a second signal; and input/output interface means, connected to the internal logic means, for receiving an input signal through the external terminal and supplying the internal logic means with the input signal as the first signal and for outputting the second signal supplied from the internal logic means to the external terminal. The input/output interface means comprises input means, connected to the external terminal, for receiving the input signal and supplying the internal logic means with the same as the first signal; selection means, connected to the input means and the internal logic means, for selecting either the first signal supplied from the input means or the second signal supplied from the internal logic means; and output means, connected to the external terminal, for outputting the selected one of the first and second signals to the external terminal. A loop circuit is formed by the input means, selection means and output means, the loop circuit logically including an odd number of inverters.

The above objects can also be achieved by a semiconductor integrated circuit device comprising external terminal; internal logic means for subjecting a first signal to a predetermined logic operation and outputting a second signal; and input/output interface means, connected to the internal logic means, for receiving an input signal through the external terminal and supplying the internal logic means with the input signal as the first signal and for outputting the second signal supplied from the internal logic means to the external terminal. The input/output interface means comprises input means, connected to the external terminal, for receiving the input signal and supplying the internal logic means with the same as the first signal; and means, connected to input means and the external terminal, for outputting the first signal supplied from the input means to the external terminal at a predetermined time. A loop circuit is formed by the input means and the output means, the loop circuit logically including an odd number of inverters.

Other objects, features and advantages of the present invention will become apparent from the following detailed description when read in conjunction with the accompanying drawings.

DETAILED DESCRIPTION

Figure 1:
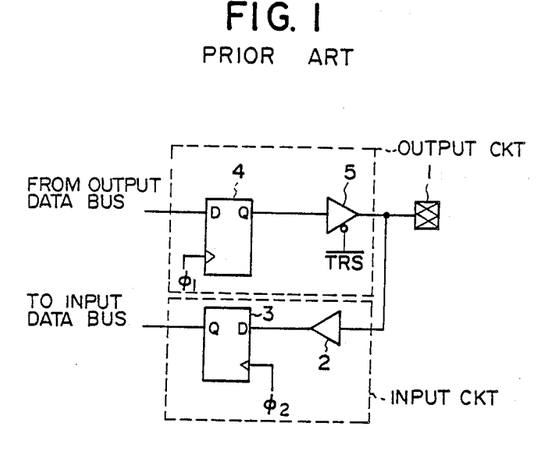
FIG. 1 is a circuit diagram illustrating an input/output interface circuit of conventional LSIs.
Figure 2:
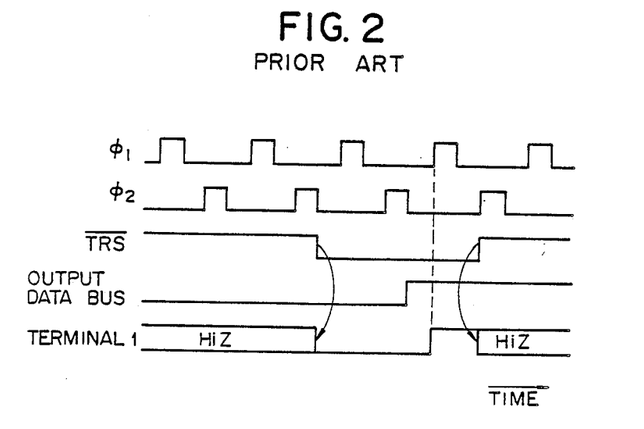
FIG. 2 is a views showing waveforms of signals obtained at different parts of the circuit of FIG.1.

A description is given of an input/output interface circuit of conventional LSIs with reference to FIGS. 1 and 2 in order to facilitate the understanding of the present invention.

Referring to FIG. 1, an input circuit connected to an external input/output terminal 1 of an LSI includes an input buffer 2, and a D-type flip-flop 3, which is connected to an internal logic circuit (not shown) through an input data bus. An output circuit includes a D-type flip-flop 4 connected to the internal logic circuit through an output data bus, and a tri-state buffer 5 connected to the external input/output terminal 1. The flip-flop 3 latches a signal applied thereto when a second clock signal $\phi_2$ shown in FIG. 2 rises. The flip-flop 4 latches a signal applied thereto when a first clock signal $\phi_1$ shown in FIG. 2 rises. The tri-state buffer 5 is activated when a control signal $\overline{TRS}$ shown in FIG. 2 is held at a low level (hereafter simply referred to L level). At this time, a signal on the output data bus appears at the external input/output terminal 1, as shown in FIG. 2. With the tri-state buffer 5 closed, the external input/output terminal 1 is kept in a high impedance state (HiZ) as shown in FIG. 2.

In DC test, a specified signal is applied to an external terminal (not shown), and then passes the internal logic circuit. Then, the specified signal is transferred to the external input/output terminal 1 through the output data bus, the flip-flop 4 and the tri-state buffer 5. When a predetermined voltage is obtained at the external input/output terminal 1, it can be found that the tri-state buffer 5 can operate correctly. However, it is impossible to directly investigate DC characteristics of the input circuit. For example, it is impossible to directly investigate whether or not the input buffer 11 operates with correct threshold levels.

Figure 3:
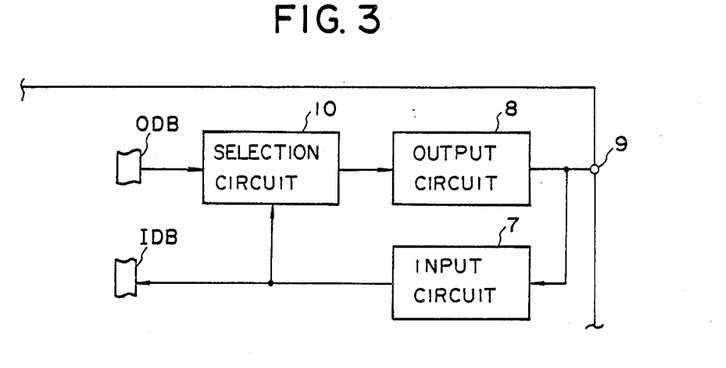
FIG. 3 is a block diagram illustrating the principle of the present invention.

A description is given of essential features of the present invention with reference to FIG. 3. Referring to this figure, an external terminal 9 is connected to an input circuit 7, which is connected to an internal logic circuit (not shown) through an input data bus IDB. The input circuit 7 is also connected to a selection circuit 10, which is connected to the internal logic circuit through an output data bus ODB. The selection circuit 10 selects either the input circuit 7 or the output data bus ODB. The selection circuit 10 is also connected to an output circuit 8, which is connected to the external terminal 9.

The present invention has the following first to third essential features. The first essential feature of the present invention is that there is formed a loop circuit including the input circuit 7 and the output circuit 8. The second essential feature of the present invention is that the loop circuit logically has an odd number of inverter elements. In other words, when a signal is applied to the external terminal 9, and passes through the input circuit 7, the selection circuit 10 and the output circuit 8, an inverted signal of the applied signal is obtained at the external terminal 9. The third essential feature of the present invention is that the input circuit 7 and the output circuit 8 are separated from each other in view of operation. For example, the input circuit 7 is driven by a clock signal, which is different from a clock signal used for driving the output circuit 8.

When testing the input circuit 7, an input voltage signal of H level, for example is applied to the external terminal 9. The applied signal passes through the input terminal 7 and is then selected by the selection circuit 10. Then the applied signal passes through the output circuit 8 and is then output to the external terminal 9. At this time, a signal of L level is output from the output circuit 8. That is, the external terminal 9 is switched to L level. Before the external terminal is switched to L level, the application of the input voltage signal is stopped. The L level of the external terminal 9 is applied to the input circuit 7. Then the output of the output circuit 8 is switched to H level. In this way, once the input voltage signal is applied to the external terminal 9, the voltage of the external terminal is alternately changed to L and H levels, when the input and output circuits 7 and 8 operate correctly. On the other hand, when no alternate level change is observed at the external terminal 9, it is determined that the input circuit 7 or the output circuit 8 has a defect. Thereby, it becomes possible to directly investigate input/output interface circuits.

Figure 4:
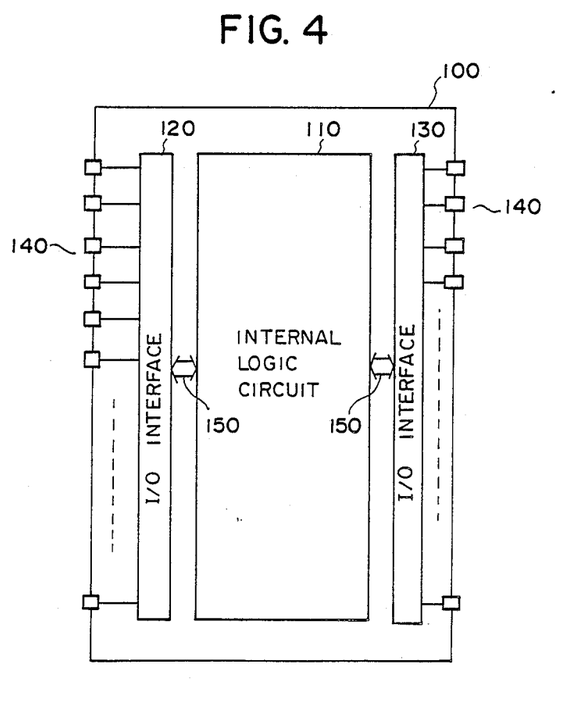
FIG. 4 is a schematic view of the entire structure of an LSI chip.

FIG. 4 is a schematic view of an example of the entire structure of the present invention. As is illustrated, on an LSI chip 100, there are formed an internal logic circuit 110, an input/output interfaces (hereafter simply referred to I/O interfaces) 120 and 130, and a plurality of external terminals 140. The I/O interfaces 120 and 130 are connected to the internal logic circuit 110 through data buses 150 including input data buses IDB and output data buses ODB as shown in FIG. 3. The structure of FIG. 3 is provided in the I/O interfaces 120 and 130.

Figure 5:
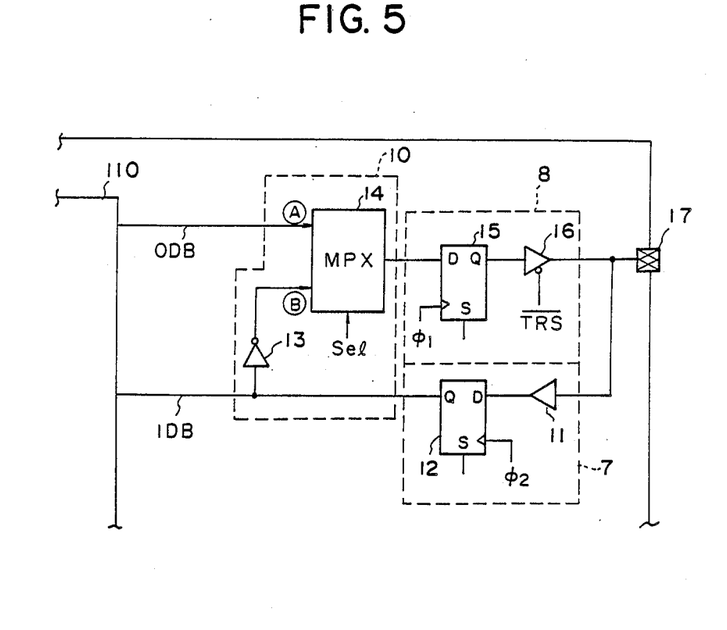
FIG. 5 is a circuit diagram of a first preferred embodiment of the present invention.
Figure 6:
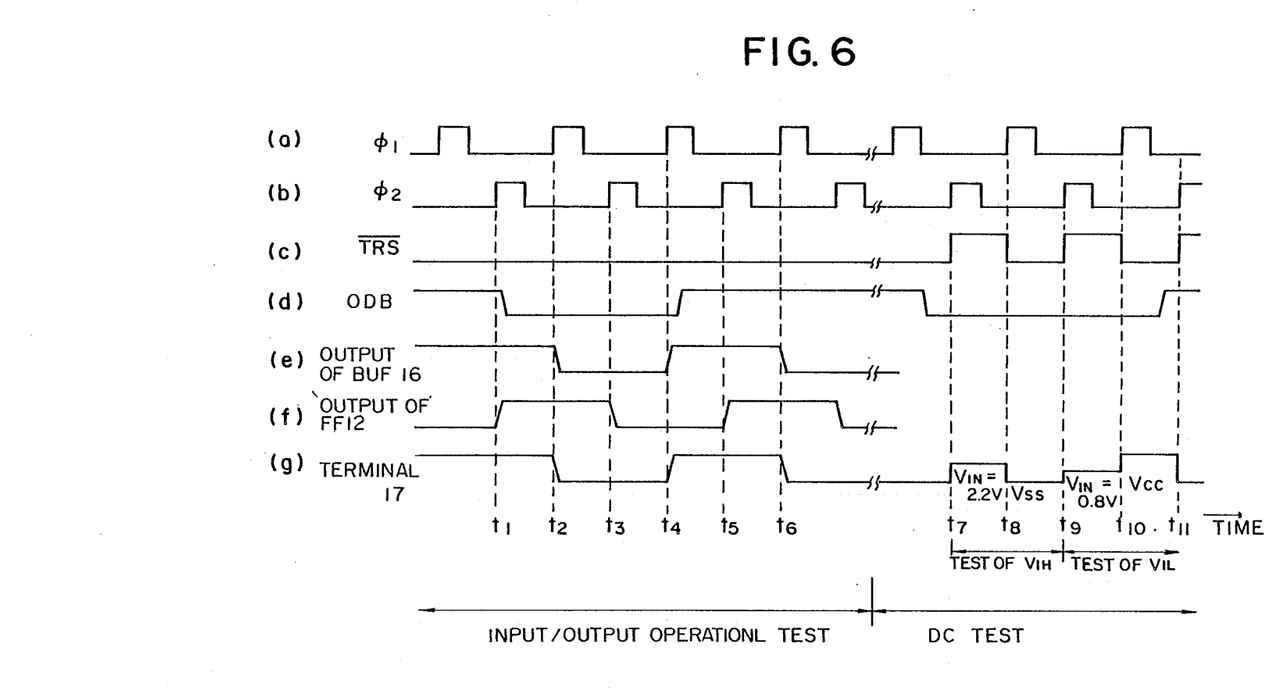
FIG. 6 is a view illustrating waveforms observed at different parts of the circuit of FIG. 5.

A description is given of a first preferred embodiment of the present invention with reference to FIGS. 5 and 6. Referring to FIG. 5, an external input/output terminal 17 corresponds to the external terminal 9 of FIG. 3 and one of the external terminals 140 shown in FIG. 4. Hereafter the external input/output terminal 17 is simply referred to as external terminal. An input buffer 11 and a D-type flip-flop 12 construct the input circuit 7 shown in FIG. 3. A D-type flip-flop 15 and a tri-state buffer 16 construct the output circuit 8 shown in FIG. 3. An inverter 13, and a multiplexer 14 served as a selector construct the selection circuit 10 shown in FIG. 3.

The flip-flop 12 latches the output signal of the input buffer 11 when the second clock signal $\phi_2$ shown in FIG. 6 rises. The Q-terminal output of the flip-flop 12 is supplied to the internal circuit 110 through the input data bus IDB, and also to a B-terminal of the multiplexer 14 through the inverter 13. The inverter 13 is provided so that an odd number of inverters is included in a loop circuit consisting of the input circuit 7, the selection circuit 10 and the output circuit 8. In the alternative, the inverter 13 may be located in the input circuit 7 or the output circuit 8. The multiplexer 14 has an A-terminal to which a signal shown in FIG. 6 is supplied from the internal logic circuit 110 through the output data bus ODB. The multiplexer 14 is controlled by a selection signal Se1, which is supplied from the internal circuit 110 or an external circuit supplied through another external terminal. The selected signal is supplied to the D-terminal of the flip-flop 15, which operates in synchronism with the first clock signal $\phi_1$. The Q-terminal of the flip-flop 15 is connected to the tri-state buffer 16, which is controlled by the control signal $\overline{TRS}$ shown in FIG. 6. When the control signal $\overline{TRS}$ is held at L level, the tri-state buffer 16 is kept at the active state. On the other hand, with the control signal $\overline{TRS}$ at H level (a high level), the tri-state buffer 16 is held in high-impedance state. The first and second clock signals $\phi_1$ and $\phi_2$ and the control signal $\overline{TRS}$ are signals used in conventional LSI devices.

Test of the input circuit 7 includes an input/output functional test and DC test. In these tests, the flip-flops 12 and 15 are initially set in the set state by set signals applied to set terminals (S) thereof supplied from the external terminal or the internal logic circuit 110, for example. At first, the input/output functional test is described at first. It is now assumed that in this state, an input signal of H level is applied to the external terminal 17, as shown in FIG. 6. The input signal passes through the input buffer 11 and is latched in synchronism with the rise of the second clock signal $\phi_2$ occurring at time $t_1$. The latched input signal is supplied to the internal logic circuit 110 through the input data bus IDB, and the B-terminal of the multiplexer 14 through the inverter 13. The latched signal from the flip-flop 12 is inverted by the inverter 13. The multiplexer 14 is supplied with the selection signal Se1 so as to select the B-terminal. Therefore, the multiplexer 14 passes the signal supplied from the inverter 13, and outputs the same to the flip-flop 15. Then the flip-flop 15 latches the supplied signal in synchronism with the rise of the first clock signal $\phi_1$ occurring at time $t_2$. Then, the latched signal is supplied to the external terminal 17 through the tri-state buffer 16. During the input/output functional test, the control signal $\overline{TRS}$ is kept at L level, as shown in FIG. 6. It is noted that the application of the input signal is stopped at a certain time between $t_1$ and $t_2$. As a result, the voltage of the external terminal 17 falls at time $t_2$. The fall of the voltage is supplied to the flip-flop 12 through the input buffer 11, and is latched therein in synchronism with the rise of the second clock signal $\phi_2$ occurring at time $t_3$. The latched signal is supplied to the flip-flop 15 through the inverter 13 and the multiplexer 14, and is latched therein in synchronism with the rise of the first clock signal $\phi_1$ occurring at time $t_4$. Then, the latched signal is output to the external terminal 17 through the tri-state buffer 16.

In this way, the level of the external terminal 17 is alternately changed to L and H levels, when the input buffer 7 and the output buffer 8 operate correctly. Adversely, if the level of the external terminal 17 does not exhibit alternate change, the input circuit 7 or the output circuit 8 is determined to be in an abnormal state.

The DC test is described below. The DC test is intended to investigate upper and lower threshold levels $V_{1H}$ and $V_{1L}$ of the input buffer 11. The input buffer 11 (a CMOS inverter, for example) is switched to a first state (L level for CMOS inverter) when the voltage applied thereto is equal to or higher than the upper threshold voltage, while switched to a second state (H level for CMOS inverter) when the voltage is equal to or lower than the lower threshold voltage. In a mode of DC test, the control signal $\overline{TRS}$ is switched to H level at times $t_7$ and $t_9$ when the second clock signal $\phi_2$ rises, and is switched to L level at times $t_8$ and $t_{10}$ when the first clock signal $\phi_1$ rises. The external terminal 17 is alternately supplied with first and second voltages in synchronism with H-level durations of the control signals $\overline{TRS}$. The first voltage is slightly higher than the upper threshold voltage $V_{1H}$, and is set equal to 2.2 volts in the case where the input buffer 11 operates in TTL level, for example. The second voltage is slightly lower than the lower threshold voltage $V_{1L}$, and is set equal to 0.8 volts in the case where the input buffer 11 operates in TTL level. As is illustrated in FIG. 6, the voltage $V_{IN}$ of the external terminal 17 is set equal to 2.2 volts during the H-level duration of the control signal $\overline{TRS}$ starting from time $t_7$, and is again set equal to 2.2 volts during the next H-level duration starting from time $t_9$.

In the case where the input buffer 12 operates correctly, the input buffer 11 outputs a first specified positive voltage (a positive power source voltage Vcc, for example) when the first voltage (2.2 volts) is applied to the external terminal 17. The voltage signal is inverted by the inverter 13, and therefore a second specified negative voltage (a negative power source voltage Vss, for example) appears in synchronism with the rise of the first clock signal $\phi_1$. In FIG. 6, the above-mentioned operation is done during the duration between times $t_7$ and $t_9$. Then, in synchronism with the next rise of the control signal $\overline{TRS}$, the voltage $V_{IN}$ of the external terminal 17 is set equal to the second voltage (0.8 volts). Then the input buffer 11 outputs the negative power source voltage Vss, which is inverted by the inverter 13, and is then applied to the flip-flop 15 through the multiplexer 14. Then the positive power source voltage Vcc appears in synchronism with the rise of the first clock signal $\phi_1$. The above-mentioned operation is done in the duration between times $t_9$ and $t_{11}$ in FIG. 6.

In this manner, it can be investigated whether or not the input buffer 7 can operate correctly. According to the first embodiment, it is possible to directly investigate input and output circuits 7 and 8. Particularly, it is noted that DC characteristics of the input circuit 7 are directly available. In other words, the input circuit 7 can be tested irrespective of the the internal logic circuit 110.

Figure 7:
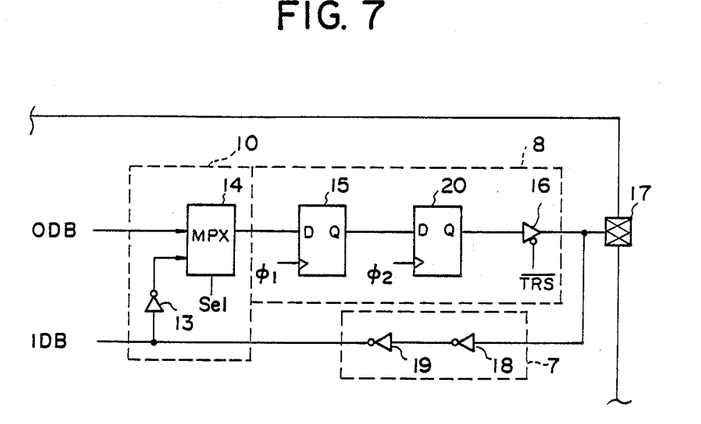
FIG. 7 is a circuit diagram of a second preferred embodiment of the present invention.

A description is given of a second preferred embodiment with reference to FIG. 7. The input circuit 7 is made up of only cascaded inverters 18 and 19. That is, an input signal is entered in the input circuit 7 without being synchronized with a clock signal such as the clock signal $\phi_2$ used in the aforementioned first embodiment. The selection circuit 10 of FIG. 7 is the same as the selection circuit 10 of FIG. 5. The output circuit 8 is constructed by providing a flip-flop 20 between the flip-flop 15 and the tri-state buffer 16 of the output circuit 8 shown in FIG. 5. The flip-flop 20 operates in synchronism with the clock signal $\phi_2$. The input circuit 7 is separated from the output circuit 8 in view of operation due to the presence of the two flip-flops 15 and 20. The inverter 13 is provided so that an odd number of inverters is logically included in the loop circuit. The second embodiment can operate in the same way as the first embodiment.

Figure 8:
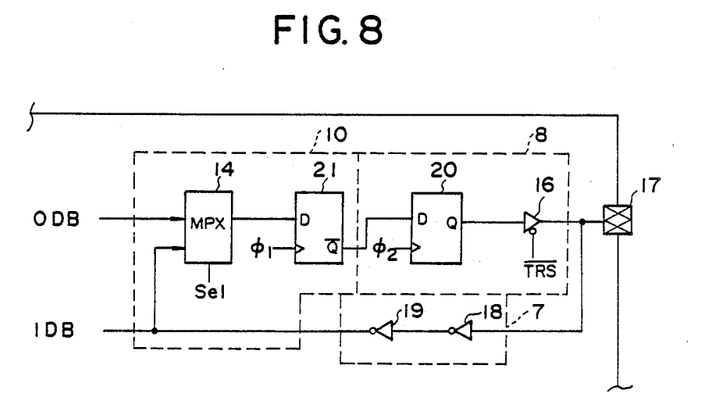
FIG. 8 is a circuit diagram of a third embodiment of the present invention.

A description is given of a third preferred embodiment with reference to FIG. 8. The input circuit 7 of the third embodiment is the same as the input circuit 7 of the second embodiment. The selection circuit 10 of the third embodiment is made up of the the multiplexer 14, and a D-type flip-flop 21, which is driven by the first clock signal $\phi_1$. The Q-terminal of the flip-flop 21 is connected to the D-terminal of the flip-flop 20 of the output circuit 8. Since the output signal of the flip-flop 21 is extracted from the $\overline{Q}$-terminal thereof, the flip-flop 21 may be considered as an inverter. As a result, the loop substantially has three inverters. The operation of the third embodiment is almost identical to that of the first and second embodiments. The third embodiment is simpler than the second embodiment.

Figure 9:
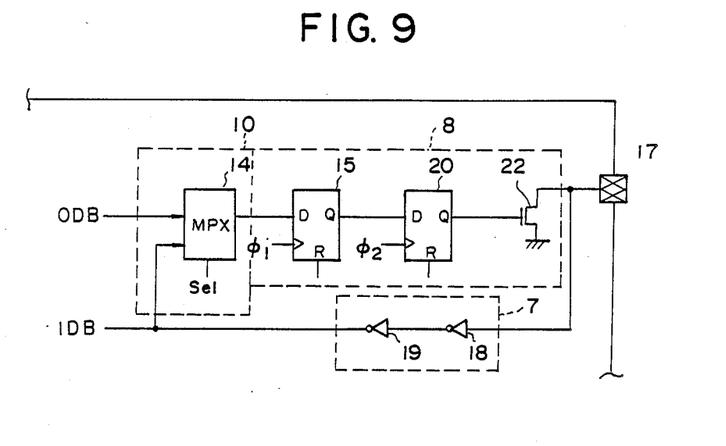
FIG. 9 is a circuit diagram of a fourth embodiment of the present invention.

A fourth embodiment is illustrated in FIG. 9. The input circuit 7 of the fourth embodiment is the same as the input circuit 7 used in the second and third embodiments. The selection circuit 10 is formed only by the multiplexer 14. The output circuit 8 is constructed by the flip-flops 15, 20, and an N-channel field effect transistor (hereafter simply referred to as NFET) 22. That is, the tri-state buffer 16 of the output circuit 7 shown in FIG. 7 is replaced with the NFET 22. The NFET 22 is an open-drain FET, and has a function of inverting the input signal applied to the external terminal 17. In the initial state, the Q-terminal of the flip-flop 20 is at L level, and thereby the NFET is OFF. In this state, the input signal of H-level is applied to the external terminal 17. The signal passes through the input circuit 7 and the selection circuit 10, and is then latched in synchronism with the rise of the first clock signal $\phi_1$. Then the Q-output signal is latched in synchronism with the rise of the second clock signal $\phi_2$. Since the potential of the Q-terminal of the flip-flop 20 is high at this time, the NFET is turned ON. As a result, the external terminal 17 is switched to L level. The L level is applied to the input circuit 7. In this way, the voltage of the external terminal 17 is alternately switched to L and H levels.

Figure 10:
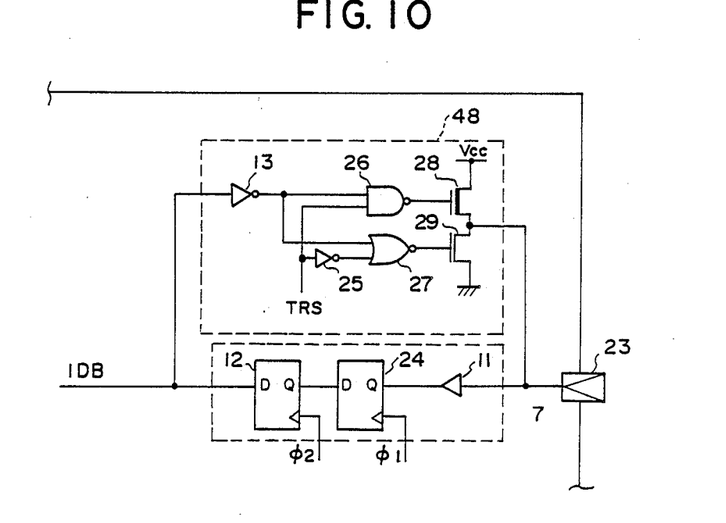
FIG. 10 is a circuit diagram of a fifth embodiment of the present invention.

A fifth embodiment of the present invention is described below with reference to FIG. 10. An external terminal 23 is an external input terminal That is, an output signal supplied from the internal logic gate 110 is not output through the external input terminal 23. The input circuit 7 is made up of the inverter 11, a D-type flip-flop 24 and flip-flop 12. In order to test the input circuit 7, an output circuit 48 is provided as illustrated in FIG. 10. The output circuit 48 of FIG. 10 is constructed by inverters 13, 25, an NAND gate 26, an NOR gate 27, a P-channel MOS transistor 28, and an N-channel MOS transistor 29. The output circuit 48 and the input circuit 7 of FIG. 10 form a loop circuit, which is activated when the input circuit 7 is tested. The input terminal of the inverter 13 is connected to the D-terminal of the flip-flop 12, and the output terminal thereof is connected to the NAND gate 26 and the NOR gate 27. The control signal $\overline{TRS}$ shown in FIG. 6 is supplied to the NAND gate 26, and the NOR gate 27 through the inverter 25. The output terminal of the NAND gate 26 is connected to the gate of the PMOS transistor 28, and the output terminal of the NOR gate 27 is connected to the gate of the NMOS transistor 29. The drains of the PMOS transistor 28 and NMOS transistor 29 are connected to the external input terminal 23. The source of the PMOS transistor 28 is connected to a positive power source (Vcc), and the source of the NMOS transistor 29 is connected to a negative power source (ground). The control signal $\overline{TRS}$ is set to H level in the input/output functional test. The input signal applied to the external input terminal 23 is inverted by the inverter 13, and is applied to the NAND gate 26 and the NOR gate 27. When the input signal is set to L level, the gate of the PMOS transistor 28 is set to H level, and the gate of the NMOS transistor 29 is set to H level. Therefore the NMOS transistor 29 makes the external input terminal 23 low, since the NMOS transistor 29 is turned ON. The L-level is applied to the input circuit 7. Therefore, the external input terminal 23 is switched to H level. In this way, the external input terminal 23 is alternately changed between H and L levels.

In the normal operation mode, the control signal $\overline{TRS}$ is set to L level, and therefore the output circuit 48 is electrically separated from the external input terminal 23.

The present invention is not limited to the aforementioned embodiments, and variations and modifications may be made without departing from the scope of the present invention.

What is claimed is:

1. A semiconductor integrated circuit device, comprising:
   an external terminal;
   internal logic means for subjecting a first signal to a predetermined logic operation and outputting a second signal; and
   input/output interface means, connected to said internal logic means, for receiving an input signal through said external terminal and supplying said internal logic means with said input signal as said first signal and for outputting said second signal supplied from said internal logic means to said external terminal,
   said input/output interface means comprising:
   input means, connected to said external terminal, for receiving said input signal and supplying said internal logic means with the same as said first signal;
   selection means, connected to said input means and said internal logic means, for selecting either said first signal supplied from said input means or said second signal supplied from said internal logic means; and
   output means, connected to said external terminal, for outputting the selected one of said first and second signals to said external terminal,
   a loop circuit being formed by said input means, selection means and output means, said loop circuit logically including an odd number of inverters.

2. A semiconductor integrated circuit device as claimed in claim 1, wherein said input means is operationally separated from said output means.

3. A semiconductor integrated circuit device as claimed in claim 1, wherein inverter means is provided in one of said input means, selection means and output means so that said loop circuit logically includes an odd number of inverters.

4. A semiconductor integrated circuit device 3, wherein said inverter means inverts said first signal supplied from said input means to generate an inverted first signal, and said inverted first signal is supplied to said selection means.

5. A semiconductor integrated circuit device as claimed in claim 3, wherein said inverter means is included in said output means.

6. A semiconductor integrated circuit device as claimed in claim 3, said inverter means is connected to said external terminals, and comprises a field effect transistor.

7. A semiconductor integrated circuit device as claimed in claim 6, wherein said field effect transistor is an open collector field effect transistor.

8. A semiconductor integrated circuit device as claimed in claim 1, wherein said input means comprises first latch means for latching said input signal, and said output means comprises second latch means for latching the selected one of said first and second signals, and wherein said first latch means latches said input signal in synchronism with a first clock signal, and said second latch means latches said selected signal in synchronism with a second clock signal, which changes with a timing different from that of said first clock signal.

9. A semiconductor integrated circuit device as claimed in claim 1, wherein said input means comprises buffer means for buffering said input signal, and operates in asynchronism with said internal logic means.

10. A semiconductor integrated circuit device as claimed in claim 1, wherein said loop circuit comprises a first flip-flop connected to said selection means, and a second flip-flop connected to an inverting terminal of said first flip-flop, and wherein said first and second flip-flops are provided between said selection means and said external terminal.

11. A semiconductor integrated circuit device as claimed in claim 10, wherein said first flip-flop operates in synchronism with a first clock signal, and said second flip-flop operates in synchronism with a second clock signal which changes with a timing different from that of said first clock signal.

12. A semiconductor integrated circuit device as claimed in claim 1, wherein said input means comprises first latch means for latching said input signal in synchronism with a first clock signal, and second latch means for latching said input signal supplied from said first latch means in synchronism with a second clock signal, which changes with a timing different from that of said first clock signal.

13. A semiconductor integrated circuit device as claimed in claim 1, wherein said output means comprises a tri-state buffer, which is kept open when said input means is tested.

14. A semiconductor integrated circuit device as claimed in claim 1, wherein said output means comprises a tri-state buffer, which is alternately kept in open and closed states when said input means is tested.

15. A semiconductor integrated circuit device as claimed in claim 14, wherein a first predetermined voltage is applied to said external terminal when said tri-state buffer is switched to the closed state, and a second predetermined voltage is applied to said external terminal when said tri-state buffer is switched to the next closed state.

16. A semiconductor integrated circuit device as claimed in claim 15, wherein said input means comprises a buffer which is switched to a first state when the voltage applied thereto is equal to or higher than an upper threshold voltage and is switched to a second state when the voltage is equal to or lower than a lower threshold voltage, and said first predetermined voltage is set slightly higher than said upper threshold level, and said second predetermined voltage is set slightly lower than said lower threshold voltage.

17. A semiconductor integrated circuit device, comprising:
external terminal;
internal logic means for subjecting a first signal to a predetermined logic operation and outputting a second signal; and
input/output interface means, connected to said internal logic means, for receiving an input signal through said external terminal and supplying said internal logic means with said input signal as said first signal and for outputting said second signal supplied from said internal logic means to said external terminal,
said input/output interface means comprising:
input means, connected to said external terminal, for receiving said input signal and supplying said internal logic means with the same as said first signal; and
output means, connected to input means and said external terminal, for outputting the first signal supplied from said input means to said external terminal at a predetermined time,
a loop circuit being formed by said input means and said output means, said loop circuit logically including an odd number of inverters.

18. A semiconductor integrated circuit device as claimed in claim 17, wherein said output means comprises inverter means for inverting said first signal supplied from said input means so as to form said loop circuit which logically includes an odd number of inverters.

19. A semiconductor integrated circuit device as claimed in claim 17, wherein said output means comprises transistor means connected to said external terminal, and gate means for driving said transistor means at said predetermined time.

20. A semiconductor integrated circuit device as claimed in claim 19, wherein said transistor means comprises a P-channel MOS transistor having a drain, source and gate, and an N-channel MOS transistor having a drain, source and gate, wherein the source and drain of said P-channel MOS transistor are connected to a positive power source and the drain of the N-channel MOS transistor, respectively, the drains of the P- and N-channel MOS transistors being connected to said external terminal, the source of said N-channel transistor being connected to a negative power source, wherein said gate means comprises first and second inverters, an NAND gate, and an NOR gate, wherein said first signal is supplied to said NAND gate, and said NOR gate through said first inverter, and a control signal is supplied to said NAND gate, and said NOR gate through said second inverter, and wherein said NAND gate is connected to the gate of said P-channel MOS transistor, and said NOR gate is connected to the gate of said N-channel MOS transistor.

21. A semiconductor integrated circuit device as claimed in claim 17, wherein said input means comprises buffer means for buffering said input signal, first latch means for latching said input signal supplied from said buffer means in synchronism with a first clock signal, and second latch means for latching said input signal supplied from said first latch means in synchronism with a second clock signal, which changes with a timing different from that of said first clock signal.

* * * * *